United States Patent
Orita et al.

(10) Patent No.: US 8,212,260 B2
(45) Date of Patent: Jul. 3, 2012

(54) P-TYPE SEMICONDUCTOR MATERIAL, SEMICONDUCTOR DEVICE, ORGANIC ELECTROLUMINESCENT DEVICE, AND METHOD FOR MANUFACTURING P-TYPE SEMICONDUCTOR MATERIAL

(75) Inventors: Masahiro Orita, Akishima (JP); Takashi Narushima, Akishima (JP); Hiroaki Yanagida, Hino (JP)

(73) Assignee: Hoya Corporation, Tokyo (JP)

( * ) Notice: Subject to any disclaimer, the term of this patent is extended or adjusted under 35 U.S.C. 154(b) by 491 days.

(21) Appl. No.: 12/311,886

(22) PCT Filed: Sep. 28, 2007

(86) PCT No.: PCT/JP2007/068971
§ 371 (c)(1),
(2), (4) Date: Apr. 17, 2009

(87) PCT Pub. No.: WO2008/050579
PCT Pub. Date: May 2, 2008

(65) Prior Publication Data
US 2010/0078626 A1    Apr. 1, 2010

(30) Foreign Application Priority Data
Oct. 23, 2006   (JP) ................. 2006-287995

(51) Int. Cl.
*H01L 29/15*    (2006.01)
(52) U.S. Cl. .......... 257/76; 257/102; 257/103; 257/200; 257/279; 257/609; 257/613

(58) Field of Classification Search ........... 257/76, 257/102, 103, 200, 279, 609, 613
See application file for complete search history.

(56) References Cited

U.S. PATENT DOCUMENTS
| | | | |
|---|---|---|---|
| 5,248,631 A | 9/1993 | Park et al. | |
| 5,574,296 A | 11/1996 | Park et al. | |
| 5,739,545 A | 4/1998 | Guha et al. | |
| 6,856,089 B2 * | 2/2005 | Hosokawa et al. | 313/506 |

FOREIGN PATENT DOCUMENTS
| | | |
|---|---|---|
| JP | A 10-223377 | 8/1998 |
| JP | B2 3078611 | 8/2000 |
| JP | A 2001-319777 | 11/2001 |
| JP | 2003017509 A * | 1/2003 |
| JP | A 2005-100893 | 4/2005 |
| WO | WO 00/67531 A1 | 11/2000 |
| WO | WO 2005/076373 A1 | 8/2005 |
| WO | WO 2006/001194 | 1/2006 |

OTHER PUBLICATIONS
Machine Translation of JP 2003-017509.*

(Continued)

*Primary Examiner* — Anthony Ho
(74) *Attorney, Agent, or Firm* — Oliff & Berridge, PLC

(57) ABSTRACT

To provide a p-type semiconductor material having a band matching with a hole injection layer and suitable for an anode electrode that can be formed on a glass substrate or a polymer substrate, and to provide a semiconductor device. In the p-type semiconductor material, $1 \times 10^{18}$ to $5 \times 10^{20}$ cm$^{-3}$ of Ag is contained in a compound containing Zn and Se, and the semiconductor device includes a substrate and a p-type electrode layer arranged on this substrate and having the aforementioned p-type semiconductor material.

8 Claims, 5 Drawing Sheets

OTHER PUBLICATIONS

Miyajima et al, "Photoluminescence Spectra of Silver-Doped ZnSe Grown by MBE," *Japanese Journal of Applied Physics*, vol. 28, No. 12, Dec. 1989, pp. 2330-2332.*

Lee et al., "Interfacial electronic structures in an organic light-emitting diode," *Applied Physics Letters*, vol. 74, No. 5, Feb. 1, 1999, pp. 670-672.

* cited by examiner (a)

(b)

P-TYPE SEMICONDUCTOR MATERIAL, SEMICONDUCTOR DEVICE, ORGANIC ELECTROLUMINESCENT DEVICE, AND METHOD FOR MANUFACTURING P-TYPE SEMICONDUCTOR MATERIAL

TECHNICAL FIELD OF THE INVENTION

The present invention relates to a p-type semiconductor material having a compound of Zn and Se, a semiconductor device and an organic electroluminescent device including this p-type semiconductor material, and a method for manufacturing the p-type semiconductor material.

DESCRIPTION OF RELATED ART

ITO (indium tin oxide) is frequently used in a hole injection layer (described as a p-type electrode hereinafter) of a conventional organic electroluminescent device (called an organic EL device hereinafter), from a viewpoint of transparency and easy availability. The ITO is formed on a glass substrate or a polymer substrate by a sputtering method and a vapor deposition method, etc. For example, ITO/NPB/Alq3/Alg3/Mg/Ag can be given as having a typical laminated structure of the organic EL device.

Here, NPB, being N,N,-bis(1-naphyl)-N, N'-diphenyl-1, 1'biphenyl-4,4'-diamne, functions as a hole transport layer, and Alga, being 8-hydroxyquinoline aluminum, functions as an electron transport layer. In such an organic EL device, light emission occurs by combination of electrons and holes injected from each electrode, in the vicinity of a joining boundary between an NPB layer, being the hole transport layer, and an Alq layer, being the electron transport layer. Accordingly, an emission luminance of the organic EL device is proportional to the number of holes or electrons injected into the electron transport layer.

Patent document 1: International Laid Open Publication No. 2005/076373

Non-patent document 1: S. T. Lee et al., Appl. Phys. lett. 74 (1999) P. 670

DISCLOSURE OF THE INVENTION

Problem to be Solved by the Invention

However, a work function of ITO is small such as 4.3 eV, thus having no band matching between the ITO as a p-type electrode and a hole transport layer adjacent thereto (NPB layer in the aforementioned example of a laminated structure). For example, in a case of the aforementioned example of the laminated structure, hole injection from ITO to NPB is performed through an energy barrier of 1.7 eV (see nonpatent document 1). Therefore, hole injection efficiency is low, thus involving a problem that a sufficient emission luminance can not be obtained as a result.

Meanwhile, patent document 1 proposes ZnSe and GaN which has a large work function and in which polarity is controlled to p-type, as a transparent material for p-type electrode having a band matching with a hole transport layer. However, these materials are used only as a single crystalline thin film, and conductivity is remarkably lost when used as a polycrystalline film. Therefore, these materials can not be used by being formed on a glass substrate or a polymer substrate.

Therefore, an object of the present invention is to provide a p-type semiconductor material having a band matching with the hole transport layer in an organic EL device, suitable for a p-type electrode that can be formed on a glass substrate and a polymer substrate, a semiconductor device and an organic EL device having this p-type semiconductor material, and a method for manufacturing the p-type semiconductor material.

Means for Solving the Problem

In order to solve the above-described problem, a p-type semiconductor material according to the present invention is characterized in that $1 \times 10^{18}$ to $5 \times 10^{20}$ cm$^{-3}$ of Ag is contained in a compound containing Zn and Se.

Also, the p-type semiconductor material according to the present invention is characterized in that the compound containing Zn and Se is expressed by a compositional formula $Zn_{(1-x)}Mg_xSe_{(1-y)}S_y(0 \leq x \leq 0.5, 0 \leq y \leq 0.5)$, and $1 \times 10^{18}$ to $5 \times 10^{20}$ cm$^{-3}$ of Ag is contained in this compound.

Also, the p-type semiconductor material according to the present invention is characterized in that content of Ag is expressed by $3 \times 10^{18}$ to $3 \times 10^{20}$ cm$^{-3}$.

Also, a semiconductor device according to the present invention includes a p-type electrode containing the aforementioned any one of the p-type semiconductor materials.

Also, the p-type semiconductor material contained in the p-type electrode of the semiconductor device according to the present invention has a columnar structure extending in a mean moving direction of holes.

Also, the organic EL device according to the present invention includes a p-type electrode containing any one of the aforementioned p-type semiconductor materials.

Further, a method for manufacturing a p-type semiconductor material made of ZnSe containing $1 \times 10^{18}$ to $5 \times 10^{20}$ cm$^{-3}$ of Ag is a vacuum deposition method, and ZnSe and Ag$_2$Se are used as a vaporization source.

Advantage Of The Invention

According to the present invention, it is possible to provide a p-type semiconductor material having a large work function and suitable for a p-type electrode that can be formed on a glass substrate and a polymer substrate, and a semiconductor device using the same, and for example when applied to an organic EL device, this p-type semiconductor material has a band matching with a hole transport layer, and an emission luminance can be improved.

BEST MODE FOR CARRYING OUT THE INVENTION

Preferred embodiments of the present invention will be specifically described hereinafter, with reference to the drawings.

Note that the present invention can be applied to a device of other kind that performs hole injection, such as a p-type electrode of a LED using an inorganic material, other than an organic EL device.

(1) Structure of the P-Type Electrode

A p-type semiconductor material according to this embodiment is formed by $1 \times 10^{18}$ to $5 \times 10^{20}$ cm$^{-3}$ of Ag as a dopant in a compound containing Zn and Se, and a semiconductor device according to the present invention is obtained by forming this p-type semiconductor material on a substrate as a p-type electrode. This p-type semiconductor material can be used, for example, as a p-type electrode material of an organic EL device, and holes can be injected into hole transport layers formed so as to be adjacent to each other.

Here, when a content of Ag is higher than $5 \times 10^{20}$ cm$^{-3}$, Ag is segregated to a grain boundary of ZnSe, thus inviting a reduction of a work function. Therefore, when the p-type semiconductor material according to this embodiment is used, for example, as an anode of the organic EL device, hole injection efficiency into the adjacent hole transport layers is deteriorated. Meanwhile, when the content of Ag is lower than $1\times10^{18}$ cm$^{-3}$, scattering of carriers occurs in the grain boundary of ZnSe, thereby causing conductivity to almost disappear.

From a viewpoint of the aforementioned effect, preferably the content of Ag is set to be $1\times10^{19}$ to $4\times10^{20}$ cm$^{-3}$, and further preferably set to be $3\times10^{19}$ to $3\times10^{20}$ cm$^{-3}$.

This is because Ag works as an acceptor in a ZnSe lattice, when the content of Ag is set within the aforementioned range.

Preferably, the p-type semiconductor material contains Mg, S, in addition to Zn, Se, Ag, and preferably is a ZnSe-based compound expressed by a compositional formula $Zn_{(1-x)}Mg_xSe_{(1-y)}Sy(0 \leq x, y \leq 0.5)$. This is because by containing Mg, a conductive band of the p-type semiconductor material can shift to an upper side, and by containing S, a valence band of the p-type semiconductor material can shift to a lower side, and therefore a band gap of the p-type semiconductor material can be widened.

In the p-type electrode, preferably the p-type semiconductor material has a columnar structure extending in a plate thickness direction of a substrate (thickness direction of the p-type electrode, being a mean moving direction of holes.). An example of the columnar structure is shown in FIG. 1. FIG. 1 is a photograph photographed using an electron microscope showing a sectional structure of the semiconductor device according to this embodiment. In this example, a p-type electrode 2 obtained by doping Ag into a ZnSe-based compound is formed on a quartz substrate 1, and ZnSe extends in a columnar shape in the plate thickness direction (vertical direction in FIG. 1) of the quartz substrate 1. By forming such a columnar shape, even in a case of a ZnSe polycrystalline body that easily allows scattering of holes to occur, practical conductivity can be obtained. Additionally, by forming the ZnSe polycrystalline body into an epitaxial film, similar effect can be obtained.

As a substrate for forming the p-type electrode in the semiconductor device, it is possible to use a single crystal of a compound semiconductor (such as GaAs, GaP, InP), and a glass substrate coated with conductive oxide (such as ITO and ZnO) on its surface. In addition, for example, a device such as a GaAs substrate/n-ZnSe:Cl/I—ZnSe/ZnSe:Ag is set as a substrate, and the p-type electrode can also be formed thereon.

(2) Deposition Method of the P-Type Electrode.

Subsequently, explanation will be given for a deposition of the p-type electrode (manufacture of the semiconductor device), with an epitaxial film of Ag-doped ZnSe taken as an example, based on FIG. 2 and FIG. 3. Here, FIG. 2 is a conceptual view of a schematic internal structure of a deposition device according to this embodiment, viewed from a side face thereof, and FIG. 2(a) is a view showing a state before starting deposition and FIG. 2(b) is a view showing a state after starting deposition, respectively. FIG. 3 is a schematic view showing a disposition of cruicbles of the deposition device according to an embodiment of the present invention, and FIG. 3(a) is a plan view showing a position of the crucibles with respect to a rotation path of a substrate holder according to this embodiment, and FIG. 3(b) is a plan view showing a disposition of the crucibles when there are four crucibles.

As shown in FIG. 2(a), the deposition of the p-type electrode is performed in such a manner that a substrate 20 is stored inside of a deposition device 10 that serves as an air-tight container, and a raw material gas stream obtained by evaporating raw materials such as Zn, Se, and Ag is supplied onto a surface of the substrate 20.

As shown in FIG. 2(a), a substrate holder 13 driven to rotate (rotate in a direction shown by arrow in FIG. 2) by a rotating shaft 12 in the deposition device 10, is provided in an upper part of the deposition device 10. Then, the substrate 20 is attached to a lower surface side of the substrate holder 13. A film thickness and a composition of a thin film to be formed can be made uniform, by attaching the substrate 20 to the substrate holder 13 and rotating the substrate holder 13 during deposition, and this is preferable.

In addition, an exhaust part 11 for adjusting a pressure in the deposition device 10 is provided on a side wall of the deposition device 10.

The pressure in the deposition device 10 is preferably set to be $1\times10^{-7}$ Torr or less during deposition. This is because when the pressure in the deposition device 10 is higher than $1\times10^{-7}$ Torr, excessive residual water is taken into the thin film during deposition, and crystallinity is impaired, thereby involving a problem that desired electric characteristics are not exhibited. Also, this is because by setting the pressure in the deposition device 10 to be $1\times10^{-7}$ Torr or less, a mean free path of atoms in the deposition device is about 1000 Km, and gas molecules contained in the raw material gas stream generated in crucibles 25, 26, 27, 28 can directly reach the surface of the substrate 20 without collision.

The crucibles 25, 26, 27 containing Zn, Se, and Ag, being raw materials, are disposed on a lower surface side of the substrate 20. At this time, in an embodiment of the present invention, as shown in FIG. 2(a) or (b), the crucibles 25, 26, 27 are disposed in a vertically lower part of the substrate 20. By disposing them this way, the raw material gas stream generated in each crucible can be made approximately vertical to the substrate 20. Also, as shown in FIG. 5, as another embodiment of the present invention, the crucibles 25, 26, 27 may be disposed so as to be inclined at a certain angle, so that each raw material gas stream is concentrated near the substrate 20.

Note that preferably the crucibles 25, 26, 27 are disposed on a rotation path 13a of the substrate holder 13, at equal angle intervals with respect to extended line 12a (namely, a center of the rotation path 13a) of the rotating shaft 12. This is because by disposing them at equal angle intervals, a supply time of the raw material gas stream to the substrate 20 from each crucible can be equalized. Note that when S or Mg is deposited, other than Zn, Se, and Ag, as shown in FIG. 3 (b), preferably the crucibles 25, 26, 27, 28 containing Zn, Se, Ag, and S or Mg respectively are disposed at equal angle intervals with respect to the extended line 12a of the rotating shaft 12.

Note that BN (boron nitride), etc, is used as a material of the crucibles 25, 26, 27. This is because BN hardly reacts with ZnSe, Zn, Se, and Ag.

Note that shutters 14 for inhibiting the raw material gas stream generated in each crucible, from being supplied to the substrate 20, are respectively provided between the substrate 20 and the crucibles 25, 26, 27. It may be acceptable that not all the shutters 14 are provided for each crucible, but one shutter 14 common to all crucibles is provided.

The crucibles 25, 26, 27, and the substrate 20 are heated to a prescribed temperature by a heating means not shown (such as an infrared lamp, a platinum wire energizing heater, a BN heater, and a SiC heater). Here, a heating temperature is set according to deposition conditions.

Then, by controlling the temperature of the crucibles 25, 26, 27 during deposition, a vapor pressure of the raw material gas stream from each crucible can be controlled, and a composition of the thin film to be formed can be controlled.

Note that the temperature of the substrate 20 during deposition is preferably set to be 200° C. or more and 400° C. or less. This is because when the temperature is set to be 200° C. or less, the raw material gas stream that reaches the substrate 20 does not crystallize, and desired electric characteristics are not exhibited. Also, this is because when the temperature is set to be 400° C. or more, the vapor pressure of ZnSe is too high to deposit a film on the substrate 20.

When the crucibles 25, 26, 27 are heated, each raw material contained in each crucible is evaporated (sublimated), to generate the raw material gas stream respectively. Then, when the raw material gas stream is generated, a shutter 14 provided between the substrate 20 and each crucible is simultaneously opened. Then, each raw material gas stream is approximately vertically supplied onto the substrate 20, and is adsorbed on the substrate 20, to thereby form a p-type electrode 21.

Thereafter, when the p-type electrode 21 having a desired film thickness is formed on the lower surface side of the substrate 20 after elapse of a prescribed time, the shutter 14 is simultaneously closed, to thereby complete deposition processing.

Note that a deposition rate is preferably set to be 5 nm/min to 30 nm/min.

This is because when the deposition rate is smaller than 5 nm/min, time is excessively required for deposition, and productivity is lowered. Also, this is because when the deposition rate is greater than 30 nm/min, the crystallinity is lowered, thus not having the columnar structure, and the desired electric characteristics can not be obtained.

As described above, Zn, Se, Ag, etc, are used as raw materials in manufacturing the p-type semiconductor material and the semiconductor device according to this embodiment. Therefore, they can be easily manufactured by a vapor deposition method and a sputtering method. In addition, Ag is substitutionally dissolved into a ZnSe lattice and works as an acceptor, to thereby generate holes. Accordingly, the p-type semiconductor material and the semiconductor device of this embodiment have a larger work function (6.3 eV) than the work function of a conventionally used ITO. Therefore, when applied to the p-type electrode of the organic EL device, it is possible to have a band matching with the hole transport layer, and an energy barrier is not created.

When Cu is used for dopant, valence control of $Cu^{2+}$ and $Cu^+$ must be performed, and deposition conditions are restricted. Meanwhile, when Ag is used for dopant, in manufacturing the p-type semiconductor material and the semiconductor device of this embodiment, only $Ag^+$ is present, and therefore the valence control is not required. Also, an ion radius (100 pm) of $Ag^+$ is considerably larger than the ion radius (60 pm) of $Cu^+$, and therefore scattering due to heat and an electric field hardly occurs in the ZnSe lattice.

Further, since the content of Ag is set within a prescribed range, it is possible to prevent the segregation in a grain boundary due to much content of Ag and decrease of the work function, and also possible to prevent scattering of carriers in the grain boundary due to small content of Ag and remarkable deterioration of conductivity.

EXAMPLES

Examples of the present invention will be described hereinafter, together with comparative examples.

Example 1

In an example 1, an epitaxial film of Ag-doped ZnSe was deposited on a p-GaAs substrate, to thereby form the semiconductor device.

A deposition device having $1 \times 10^{-8}$ Torr ultimate vacuum was used. A BN crucible containing 1 g ZnSe raw material was heated to 830° C., and a BN crucible containing 0.1 g $Ag_2Se$ was heated to 775° C., and the temperature of a p-GaAs substrate was increased to 250° C. by an IR lamp (infrared lamp), and a shutter in the lower part of the substrate was opened. In this state, the deposition was performed.

It was confirmed that epitaxial growth was progressed, by using an In-plane X-ray diffraction method and a transmission electron microscope.

The film thickness of the epitaxial film measured by a stylus type step difference gage was 400 nm, and a chemical composition analyzed by an ICP method was Zn:Se:Ag=49.4:50.2:0.33 (at %). In addition, Ag concentration analyzed by an SIMS method was $1 \times 10^{20}$ cm$^{-3}$, and was uniform in a film thickness direction, and resistivity was $6.8 \times 10^4$ Ωcm. Current-voltage characteristics in the film thickness direction were excellent as shown in FIG. 4. Here, FIG. 4 is a view showing the current-voltage characteristics of ZnSe:Ag/p-GaAs (the semiconductor device according to the example 1 formed by depositing Ag-doped ZnSe on p-GaAs).

Example 2

In an example 2, an Ag-doped ZnSe film was deposited on a glass substrate with ITO, to thereby form the semiconductor device. Deposition conditions are the same as those of the example 1.

The film thickness of ZnSe measured by the stylus type step difference gage was 400 nm, and the chemical composition analyzed by the ICP method was Zn:Se:Ag=49.4:50.2:0.33 (at %). Then, Ag concentration analyzed by the SIMS method was $1 \times 10^{20}$ cm$^{-3}$, and was uniform in the film thickness direction. When a sectional face was observed by TEM, a columnar particle structure was confirmed. The work function measured by an ultraviolet photoelectron spectroscopy was 6.3 eV. In addition, the resistivity was $6.8 \times 10^4$ Ωcm. The current-voltage characteristics in the film thickness direction were excellent in the same way as the example 1.

Example 3

In an example 3, an epitaxial film of Ag-doped ZnSe was deposited on a p-GaAs substrate, to thereby form the semiconductor device.

The deposition device having $1 \times 10^{-8}$ Torr ultimate vacuum was used. A BN crucible containing 1 g ZnSe raw material was heated to 830° C., and a BN crucible containing 0.1 g $Ag_2Se$ was heated to 750° C., and the temperature of the p-GaAs substrate was increased to 250° C. by the IR lamp (infrared lamp), and the shutter in the lower part of the substrate was opened. In this state, the deposition was performed.

It was confirmed that the epitaxial growth was progressed, by using the In-plane X-ray diffraction method and the transmission electron microscope.

The film thickness of the Ag-doped ZnSe film measured by the stylus type step difference gage was 400 nm, and the chemical composition analyzed by the ICP method was Zn:Se:Ag=49.7:50.2:0.08 (at %). In addition, the Ag concentration analyzed by the SIMS method was $3 \times 10^{19}$ cm$^{-3}$, and was uniform in the film thickness direction, and the work function measured by the ultraviolet photoelectron spectroscopy was 6.3 eV. Also, the resistivity was $8.8 \times 10^5$ Ωcm. The current-voltage characteristics in the film thickness direction were excellent in the same way as the example 1.

Example 4

In an example 4, the epitaxial film of Ag-doped ZnSe was deposited on a p-GaAs substrate, to thereby form the semiconductor device.

The deposition device having $1\times10^{-8}$ Torr ultimate vacuum was used. The BN crucible containing 1 g ZnSe raw material was heated to 830° C., and the BN crucible containing 0.1 g $Ag_2Se$ was heated to 730° C., and the temperature of the p-GaAs substrate was increased to 250° C. by the IR lamp (infrared lamp), and the shutter in the lower part of the substrate was opened. In this state, the deposition was performed.

It was confirmed that the epitaxial growth was progressed, by using the In-plane X-ray diffraction method and the transmission electron microscope.

The film thickness of the Ag-doped ZnSe film measured by the stylus type step difference gage was 400 nm, and the chemical composition analyzed by the ICP method was Zn:Se:Ag=49.8:50.1:0.01 (at %). In addition, the Ag concentration analyzed by the SIMS method was $3\times10^{18}$ cm$^{-3}$, and was uniform in the film thickness direction, and the work function measured by the ultraviolet photoelectron spectroscopy was 6.1 eV. Also, the resistivity was $7.5\times10^8$ Ωcm. The current-voltage characteristics in the film thickness direction were excellent in the same way as the example 1.

Comparative Example 1

In a comparative example 1, the epitaxial film of Ag-doped ZnSe was deposited on the p-GaAs substrate, to thereby form the semiconductor device.

The deposition device having $1\times10^{-8}$ Torr ultimate vacuum was used. The BN crucible containing 1 g ZnSe raw material was heated to 830° C., and the BN crucible containing 0.1 g $Ag_2Se$ was heated to 830° C., and the temperature of the p-GaAs substrate was increased to 250° C. by the IR lamp (infrared lamp), and the shutter in the lower part of the substrate was opened. In this state, the deposition was performed.

The film thickness of the Ag-doped ZnSe film measured by the stylus type step difference gage was 400 nm, and the chemical composition analyzed by an ICP method was Zn:Se:Ag=47.2:50.3:2.5 (at %). In addition, the Ag concentration analyzed by the SIMS method was $1\times10^{21}$ cm$^{-3}$, and was uniform in the film thickness direction. However, it was confirmed that Ag was segregated to the grain boundary, by using the in-plane X-ray diffraction method and the transmission electron microscope. The work function measured by the ultraviolet photoelectron spectroscopy was 5.1 eV, and the resistivity was $3.3\times10^2$ Ωcm.

Comparative Example 2

In a comparative example 2, the epitaxial film of Ag-doped ZnSe was deposited on the p-GaAs substrate, to thereby form the semiconductor device.

The deposition device having $1\times10^{-8}$ Torr ultimate vacuum was used. The BN crucible containing 1 g ZnSe raw material was heated to 830° C., and the BN crucible containing 0.1 g $Ag_2Se$ was heated to 700° C., and the temperature of the p-GaAs substrate was increased to 250° C. by the IR lamp (infrared lamp), and the shutter in the lower part of the substrate was opened. In this state, the deposition was performed.

It was confirmed that the epitaxial growth was progressed, by using the In-plane X-ray diffraction method and the transmission electron microscope.

The film thickness of the Ag-doped ZnSe film measured by the stylus type step difference gage was 400 nm, and the chemical composition analyzed by the ICP method was Zn:Se:Ag=49.8:50.2:0.002 (at %). In addition, the Ag concentration analyzed by the SIMS method was $5\times10^{17}$ cm$^{-3}$, and was uniform in the film thickness direction. The work function by using the ultraviolet photoelectron spectroscopy and the resistivity could not be measured, because conductivity of the film was excessively low.

Ag concentrations of examples 1 to 4 and comparative examples 1 to 2, work functions and values of the resistivity are collectively shown in table 1.

TABLE 1

| Sample | Ag concentration (/cm$^3$) | Work function (eV) | Resistivity (Ω cm) |
|---|---|---|---|
| Example 1 | $1\times10^{20}$ | 6.3 | $6.8\times10^4$ |
| Example 2 | $1\times10^{20}$ | 6.3 | $6.8\times10^4$ |
| Example 3 | $3\times10^{19}$ | 6.3 | $8.8\times10^5$ |
| Example 4 | $3\times10^{18}$ | 6.1 | $7.5\times10^6$ |
| Comparative example 1 | $1\times10^{21}$ | 5.1 | $3.3\times10^2$ |
| Comparative example 2 | $5\times10^{17}$ | — | — |

The present invention has been described, with reference to the aforementioned embodiments. However, the present invention is not limited to the aforementioned embodiments, and can be modified within a scope of an object of improvement or concept of the present invention.

DESCRIPTION OF SIGNS AND NUMERALS

Figure 1:
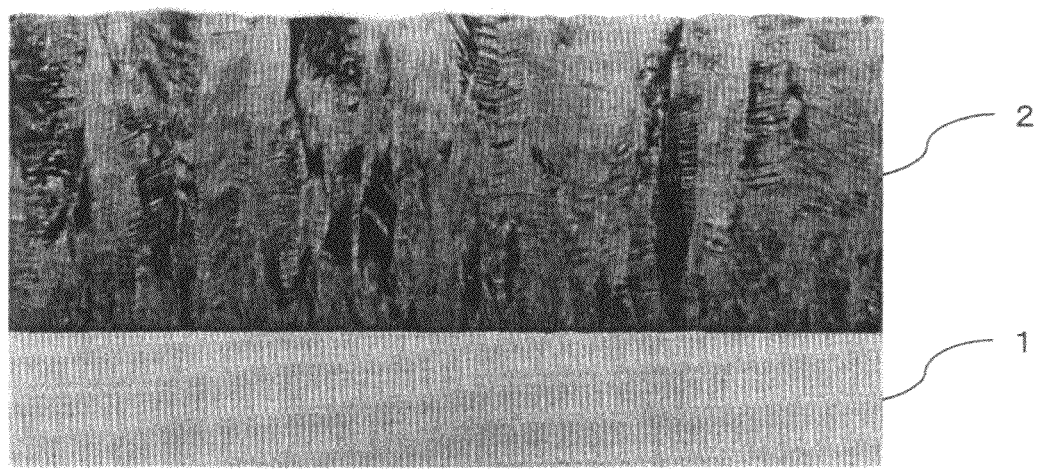
FIG. 1 is an electron microscope photography showing a sectional structure of a semiconductor device according to an embodiment of the present invention.
Figure 2:
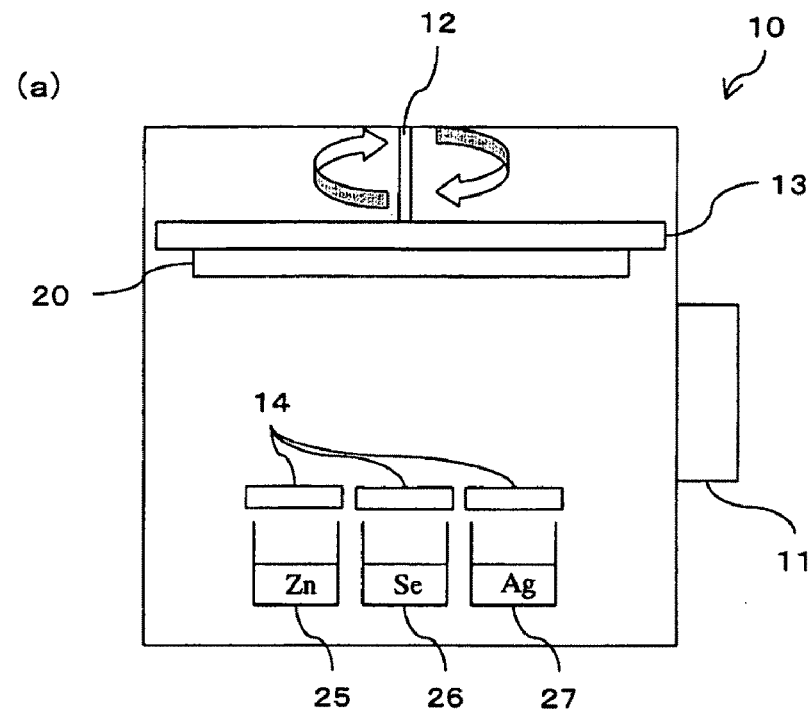
FIG. 2 is a conceptual view of a schematic internal structure of a deposition device according to an embodiment of the present invention, viewed from a side face thereof, wherein FIG. 2(*a*) shows a state before starting deposition, and FIG. 2(*b*) shows a state after starting deposition, respectively.
Figure 2:
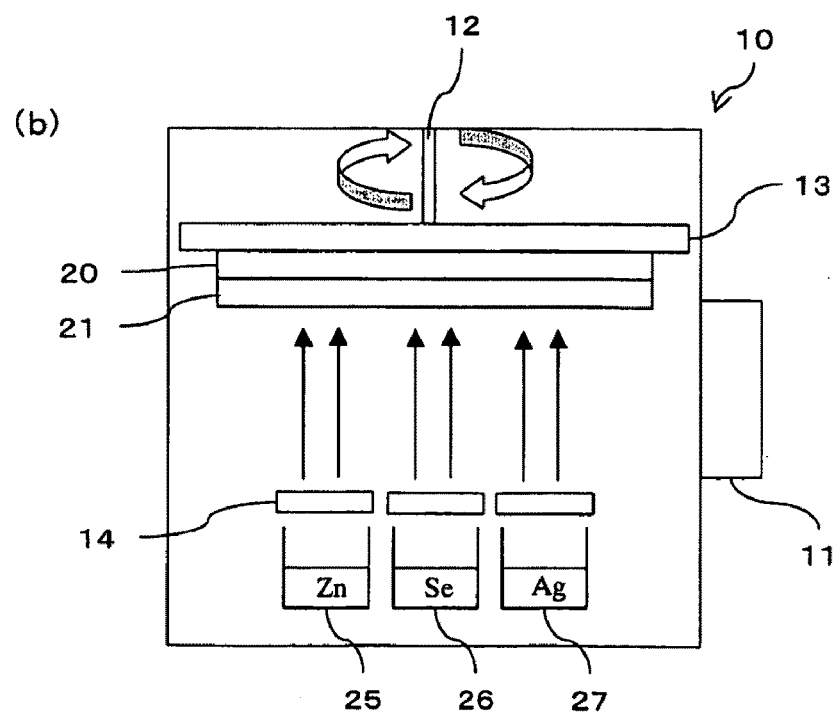
Figure 3:
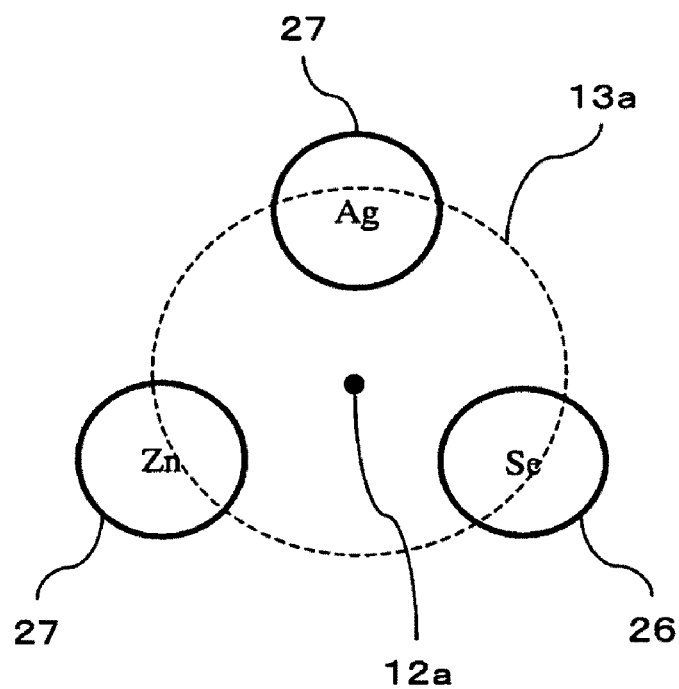
FIG. 3 is a schematic view showing a disposition of crucibles of the deposition device according to an embodiment of the present invention, FIG. 3(*a*) is a plan view showing an example of disposition of the crucibles with respect to a rotation path of a substrate holder according to an embodiment of the present invention, and FIG. 3(*b*) is a plan view showing an example of the disposition of the crucibles when there are four crucibles.
Figure 3:
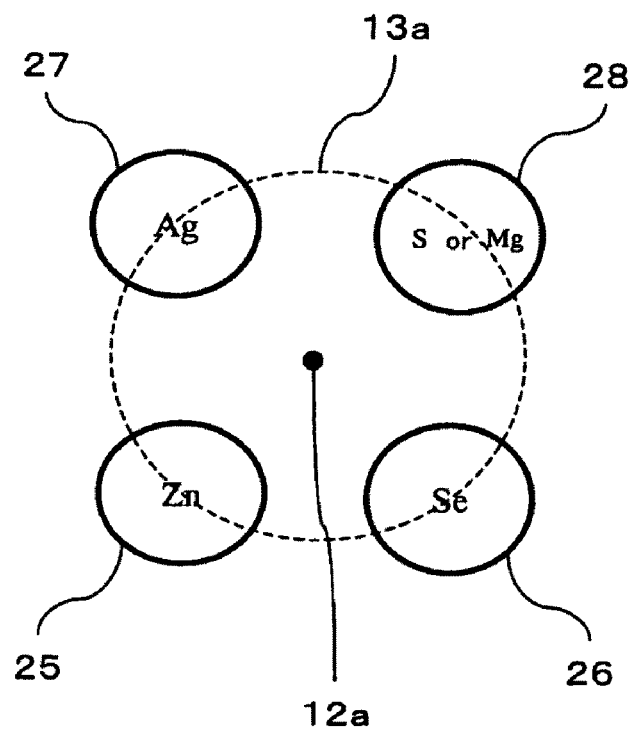
Figure 4:
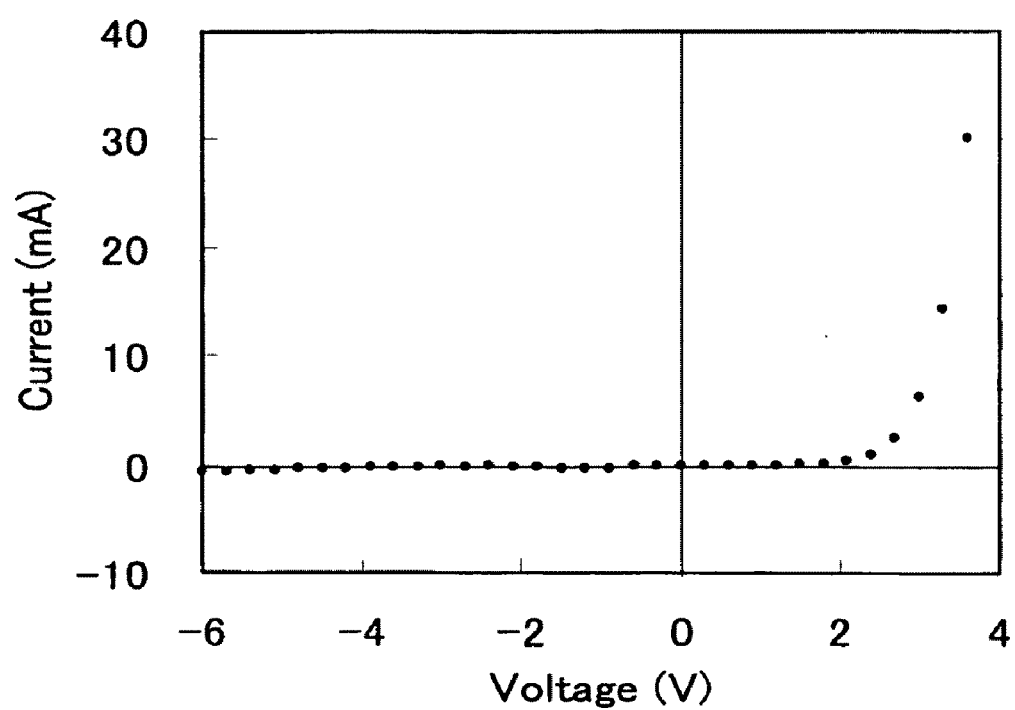
FIG. 4 is a view showing current-voltage characteristics of the semiconductor device according to an example 1.
Figure 5:
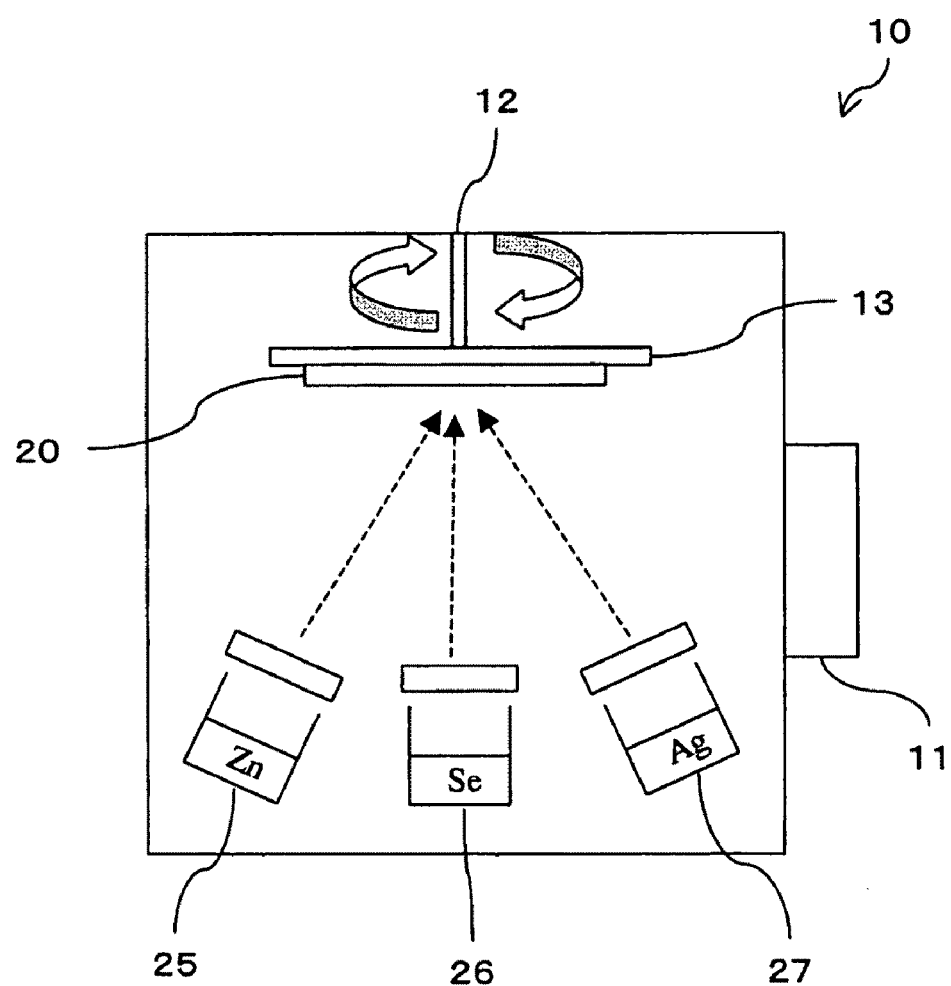
FIG. 5 is a conceptual view of the schematic internal structure of the deposition device according to other embodiment of the present invention, viewed from a side face thereof, and is a view showing a state of disposing the crucibles, so as to be inclined at a certain angle, so that each raw material gas stream is concentrated near a substrate.

1 Quartz substrate
2 p-type electrode layer
10 Deposition device
20 Substrate
21 p-type electrode
25 Crucible
26 Crucible
27 Crucible

What is claimed is:

1. A p-type semiconductor material, wherein a value of a work function is in a range of from more than 6.1 to 6.3 eV, and $3\times10^{19}$ to $5\times10^{20}$ cm$^{-3}$ of Ag is contained in a compound containing Zn and Se.

2. The p-type semiconductor material according to claim 1, wherein $3\times10^{19}$ to $3\times10^{20}$ cm$^{-3}$ of Ag is contained in the compound containing Zn and Se.

3. The p-type semiconductor material according to claim 1, wherein the compound containing Zn and Se is expressed by a compositional formula $Zn_{(1-x)}Mg_x Se_{(1-y)})S_y (0 \leq x \leq 0.5, 0 \leq y \leq 0.5)$.

4. A semiconductor device, comprising a p-type electrode containing the p-type semiconductor material according to claim 1.

5. The semiconductor device according to claim 4, wherein a structure of the p-type semiconductor material contained in the p-type electrode is a columnar structure extending in a mean moving direction of holes.

6. The semiconductor device according to claim 4, wherein the p-type semiconductor material contained in the p-type electrode is a film obtained by being epitaxial-grown on a p-type GaAs layer, and a p-p junction between the p-type semiconductor material and the p-type GaAs layer has rectification characteristics.

7. An organic electroluminescent device, comprising a p-type electrode containing the p-type semiconductor material according to claim 1.

8. A method for manufacturing a p-type semiconductor material, containing $3\times10^{19}$ to $5\times10^{20}$ cm$^{-3}$ of Ag in ZnSe, using a vacuum deposition method as a manufacturing method, and using ZnSe and $Ag_2Se$ as a vaporization source, with a value of a work function of the p-type semiconductor material set to be in a range from more than 6.1 to 6.3 eV.

* * * * *